US008575956B2

(12) United States Patent
Lee

(10) Patent No.: US 8,575,956 B2
(45) Date of Patent: Nov. 5, 2013

(54) SEMICONDUCTOR DEVICE

(75) Inventor: Geun-Il Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 67 days.

(21) Appl. No.: 13/285,174

(22) Filed: Oct. 31, 2011

(65) Prior Publication Data
US 2013/0033288 A1    Feb. 7, 2013

(30) Foreign Application Priority Data

Aug. 1, 2011  (KR) .................. 10-2011-0076424

(51) Int. Cl.
*H03K 19/003*    (2006.01)
(52) U.S. Cl.
USPC ............................................. 326/30; 326/31
(58) Field of Classification Search
USPC ......................................... 326/21, 29, 30, 31
See application file for complete search history.

(56) References Cited

U.S. PATENT DOCUMENTS

| 6,762,620 B2* | 7/2004 | Jang et al. ............. 326/30 |
| 2007/0018682 A1* | 1/2007 | Lin et al. ............. 326/30 |
| 2010/0007373 A1* | 1/2010 | Wong ................ 326/30 |

FOREIGN PATENT DOCUMENTS

| KR | 1020080114086 | 12/2008 |
| KR | 1020100131746 | 12/2010 |

OTHER PUBLICATIONS

Notice of Allowance issued by the Korean Intellectual Property Office on Feb. 28, 2013.

* cited by examiner

*Primary Examiner* — James H Cho
(74) *Attorney, Agent, or Firm* — IP & T Group LLP

(57) ABSTRACT

A semiconductor device includes an impedance control signal generation unit configured to generate an impedance control signal for controlling an impedance value, a first processing unit configured to process the impedance control signal in response to a first setup value and generate a first process signal, a first clock termination unit configured to be coupled with a first clock path and determine an impedance value responding to the impedance control signal, and a second clock termination unit configured to be coupled with a second clock path and determine an impedance value responding to the first process signal.

18 Claims, 5 Drawing Sheets

SEMICONDUCTOR DEVICE

CROSS-REFERENCE TO RELATED APPLICATIONS

The present application claims priority of Korean Patent Application No. 10-2011-0076424, filed on Aug. 1, 2011, which is incorporated herein by reference in its entirety.

BACKGROUND

1. Field

Exemplary embodiments of the present invention relate to a semiconductor device capable of controlling impedance.

2. Description of the Related Art

Semiconductor devices may include systems and features to accurately control the duty cycle of a clock in a clock-based system. The duty cycle of a clock is the ratio of high-pulse duration or low-pulse duration to the period of the clock. Recent memory devices, particularly, a Double Data Rate (DDR) synchronous memory device, use clocks, for example, for data strobe. Two-bit data is inputted and outputted consecutively in synchronization with a rising edge and a falling edge of a clock. If the duty cycle of a clock does not maintain approximately 50%, inputted and outputted data may be distorted. Therefore, it is important to accurately control the duty cycle of a clock in a memory device.

A clock inputted into a memory device is generated in an external clock generator and transferred to the memory device through a transfer line. In this configuration, the duty cycle of a clock is may be distorted because the high-pulse duration and the low-pulse duration of a clock become different due to mismatch of a clock generator, external noise during the transferring, and attenuation of the amplitude of an electrical signal on the transfer line. To control the duty cycle of the clock, a duty cycle corrector for correcting the duty cycle may be used in a memory device. However, even if the duty cycle corrector is used, it is difficult to maintain the duty cycle at 50% due to on-chip power noise.

SUMMARY

Exemplary embodiments of the present invention are directed to a semiconductor device that may decrease distortion of a duty cycle by changing a termination resistance value according to the extent of duty cycle distortion.

In accordance with an embodiment of the present invention, a semiconductor device includes: an impedance control signal generation unit configured to generate an impedance control signal for controlling an impedance value; a first processing unit configured to process the impedance control signal in response to a first setup value and generate a first process signal; a first clock termination unit configured to be coupled with a first clock path and determine an impedance value responding to the impedance control signal; and a second clock termination unit configured to be coupled with a second clock path and determine an impedance value responding to the first process signal.

The semiconductor device may further include: a first data termination unit configured to be coupled with a first data path and determine an impedance value responding to the impedance control signal; and a second data termination unit configured to be coupled with a second data path and determine an impedance value responding to the first process signal.

In accordance with another embodiment of the present invention, a semiconductor device includes: an impedance control signal generation unit configured to generate an impedance control signal for correcting an impedance value; a first processing unit configured to process the impedance control signal in response to a first setup value and generate a first process signal; a second processing unit configured to process the impedance control signal in response to a second setup value and generate a second process signal; a first termination unit configured to be coupled with a command-based path and determine an impedance value responding to the first process signal; and a second termination unit configured to be coupled with a data-based path and determine an impedance value responding to the second process signal.

DETAILED DESCRIPTION

Figure 1:
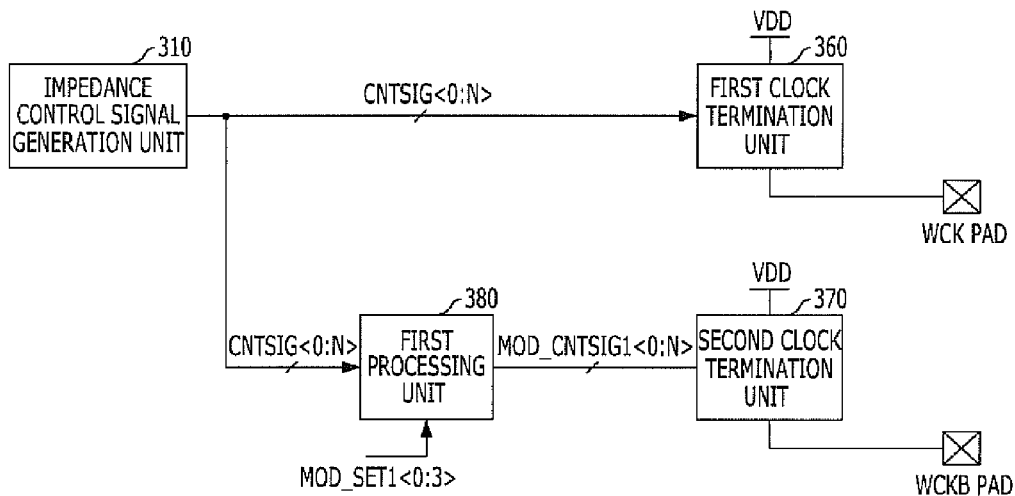
FIG. 1 is a block view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The duty cycle of a clock may be controlled by increasing or decreasing the overall voltage level of a clock. The overall voltage level is a common mode voltage level. Therefore, the duty cycle of a clock may be controlled by increasing or decreasing the common mode voltage level. More specifically, when the common mode voltage level is increased, the high-pulse duration of a clock becomes longer, and when the common mode voltage level is decreased, the low-pulse duration of a clock becomes longer.

The common mode voltage level of a clock may be changed by controlling a termination resistance value. For example, when the intensity of pull-up termination is strong (more specifically, when the pull-up termination resistance value is decreased), the common mode voltage level is increased. When the intensity of pull-up termination is weak (more specifically, when the pull-up termination resistance value is increased), the common mode voltage level is decreased.

In other words, the duty cycle of a clock may be controlled by the changing termination resistance value. Hereafter, a semiconductor device capable of controlling a termination resistance value is described in detail.

FIG. 1 is a block view illustrating a semiconductor device in accordance with a first embodiment of the present invention.

Referring to FIG. 1, the semiconductor device includes an impedance control signal generation unit 310, a first processing unit 380, a first clock termination unit 360, and a second clock termination unit 370.

The impedance control signal generation unit 310 generates an impedance control signal CNTSIG<0:N>, a signal for correcting an offset value from a termination resistance value according to a change in process, voltage, and/or temperature (PVT). Since the impedance control signal generation unit 310 is a widely known circuit, for example, a ZQ calibration circuit, further description is not provided.

The first processing unit 380 processes the impedance control signal CNTSIG<0:N> in response to a first setup value MOD_SET1<0:3> and generates a first process signal MOD_CNTSIG1<0:N>. The first setup value MOD_SET1<0:3> is a signal used to correct a duty cycle. The first processing unit 380 may include a subtractor/adder for increasing or decreasing the value of the impedance control signal CNTSIG<0:N> based on the first setup value MOD_SET1<0:3>. In order to communicate whether to subtract or add, the first bit MOD_SET1<3> of the first setup value MOD_SET1<0:3> tells the subtractor/adder to add or subtract. The other bits MOD_SET1<0:2> of the first setup value MOD_SET1<0:3> are values to be subtracted or added by the subtractor/adder. The configuration of the first setup value MOD_SET1<0:3> is shown in the following Table 1.

TABLE 1

| Configuration of the first setup value MOD_SET1<0:3> | |
|---|---|
| subtraction/addition signal | control signals |
| 1: addition (+) | 001 to 111 |
| 0: subtraction (−) | 001 to 111 |

The first setup value MOD_SET1<0:3> is information to correct the duty cycle. As described above, the amount of duty cycle distortion of a data clock may be minimized by controlling the termination resistance value. Therefore, the duty cycle of the data clock may be corrected by controlling the termination resistance value through the first setup value MOD_SET1<0:3>.

In a semiconductor memory device, a termination impedance value is set up based on Mode Register Setting (MRS) or Extended Mode Register Setting (EMRS). As a result, in a semiconductor memory device, the first setup value MOD_SET1<0:3> is a signal outputted from a mode register setting circuit or an extended mode register setting circuit.

A first process signal MOD_CNTSIG1<0:N> is output from the first processing unit 380. The following is an example of how the first process signal MOD_CNTSIG1<0:N> is generated by the first processing unit 380. In this example, the impedance control signal CNTSIG<0:N> signal is described as having six bits, but the present invention is not limited to an impedance control signal having six bits, and more or fewer bits may be used. For example, when the subtraction/addition signal MOD_SET1<3> is '1', an addition (+) of signals is performed, and when the subtraction/addition signal MOD_SET1<3> is '0', a subtraction (−) of signals is performed. Furthermore, when the impedance control signal CNTSIG<0:5> is '101010' and the first setup value MOD_SET1<0:3> is '1001', the subtraction/addition signal MOD_SET1<3> is '1' and an addition (+) operation is performed. The control signal MOD_SET1<0:2> is the remaining bits of the first setup value MOD_SET1<0:3>, which is '001' in the example above. Therefore, the first processing unit 380 adds (+) the control signal MOD_SET1<0:2> to the impedance control signal CNTSIG<0:5> and outputs a first process signal MOD_CNTSIG1<0:5>. Conversely, when the first setup value MOD_SET1<0:3> is '0001', the subtraction/addition signal MOD_SET1<3> is '0' and a subtraction (−) operation is performed. Again, the control signal MOD_SET1<0:2> is the remaining bits of the first setup value MOD_SET1<0:3>, which again is '001'. Therefore, the first processing unit 380 subtracts (−) the control signal MOD_SET1<0:2> from the impedance control signal CNTSIG<0:5> and outputs a first process signal MOD_CNTSIG1<0:5>.

The first clock termination unit 360 is coupled with a first clock path and has an impedance value decided based on the impedance control signal CNTSIG<0:N>.

The second clock termination unit 370 is coupled with a second clock path and has an impedance value decided based on the first process signal MOD_CNTSIG1<0:N>.

For illustration purposes, FIG. 1 illustrates a case where a first clock is a main data clock WCK, and a second clock is a sub data clock WCKB. The first clock termination unit 360 terminates a main data clock (WCK) pad with an impedance value decided based on the impedance control signal CNTSIG<0:N>. The first clock termination unit 360 matches the impedance of the main data clock WCK that is inputted into the main data clock pad. Herein, the main data clock pad means a pad that receives the main data clock WCK for strobing data. The second clock termination unit 370 terminates a sub data clock (WCKB) pad with an impedance value decided based on the first process signal MOD_CNTSIG1<0:N>. The second clock termination unit 370 matches the impedance of the sub data clock WCKB that is inputted into the sub data clock pad. Herein, the sub data clock pad means a pad that receives the sub data clock WCKB, which is an inverse clock signal of the main data clock WCK.

The level of a data clock is decided based on the relative level difference between the main data clock WCK and the sub data clock WCKB. In other words, when the main data clock WCK is greater than the sub data clock WCKB, the level of the data clock is high. When the main data clock WCK is lower than the sub data clock WCKB, the level of the data clock is low.

When the duration where the main data clock WCK is greater than the sub data clock WCKB and the duration where the sub data clock WCKB is greater than the main data clock WCK are different from each other, the duty cycle of a data clock is not 50%. Therefore, the duty cycle is distorted because the high-pulse duration and the low-pulse duration of the data clock are different.

When the duty cycle of the data clock is distorted, the duty cycle may be corrected by controlling the common mode voltage level of either the main data clock WCK or the sub data clock WCKB. For example, when the high-pulse duration of the data clock is longer than the low-pulse duration, the common mode voltage level of the main data clock WCK may be decreased. By decreasing the common mode voltage level of the main data clock, the duration where the main data clock WCK is greater than the sub data clock WCKB is decreased, and the high-pulse duration of the data clock is reduced. Also, the high pulse duration of the data clock can be reduced by increasing the common mode voltage level of the sub data clock WCLK. In other words, if the common mode voltage level of the sub data clock WCKB is increased, the duration where the main data clock WCK is greater than the sub data clock WCKB is decreased, and thus the high-pulse width of the data clock is decreased.

In the first embodiment, the common mode voltage level of the main data clock WCK or the sub data clock WCKB may be changed by controlling the termination resistance value of the main data clock WCK or the sub data clock WCKB. More specifically, when the termination resistance value of the main data clock WCK is increased, the common mode voltage level of the main data clock WCK is decreased, and when the termination resistance value of the main data clock WCK is decreased, the common mode voltage level of the main data clock WCK is increased. Likewise, when the termination resistance value of the sub data clock WCKB is increased, the common mode voltage level of the sub data clock WCKB is decreased, and when the termination resistance value of the sub data clock WCKB is decreased, the common mode voltage level of the sub data clock WCKB is increased.

Therefore, the semiconductor device according to an embodiment of the present invention may correct the duty cycle of a clock by controlling the termination resistance value of either a first clock or a second clock.

Figure 2:
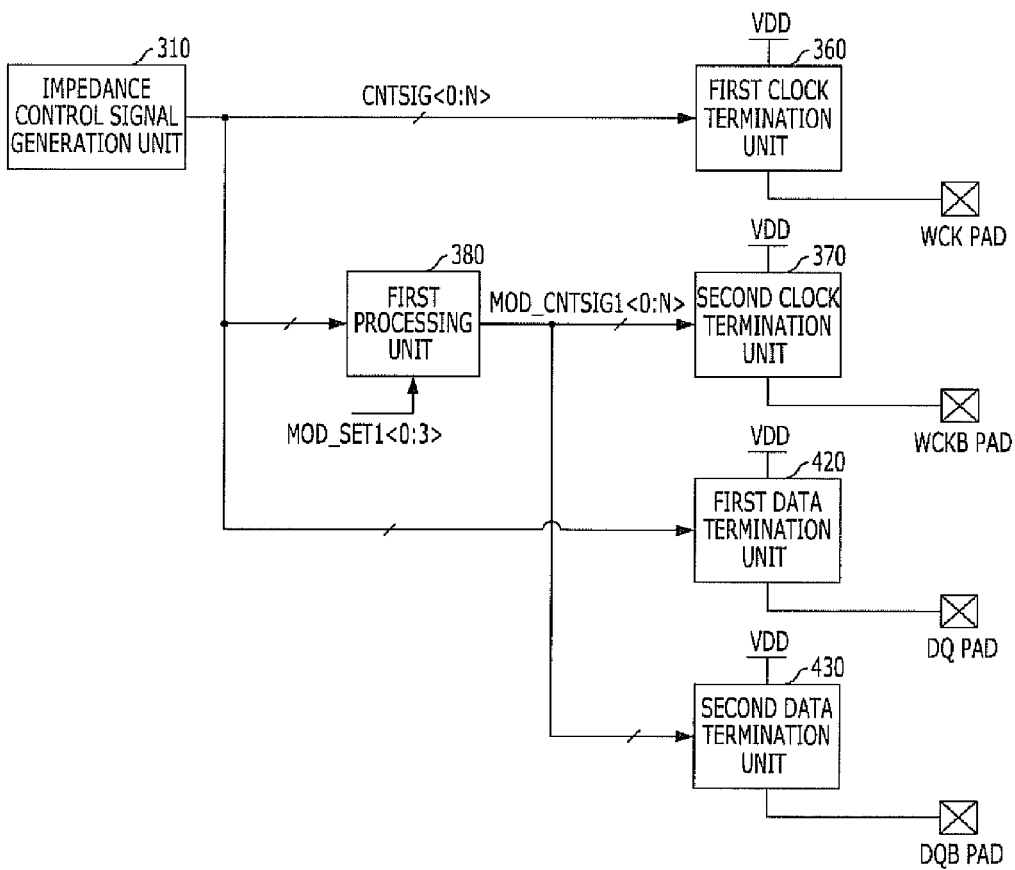
FIG. 2 is a block view illustrating a semiconductor device in accordance with a second embodiment of the present invention.

FIG. 2 is a block view illustrating a semiconductor device in accordance with a second embodiment of the present invention.

Referring to FIG. 2, the semiconductor device in accordance with the second embodiment of the present invention may further include the first data termination unit 420 and the second data termination unit 430 in addition to the structure of the semiconductor device in accordance with the first embodiment of the present invention.

The structures and operations of the impedance control signal generation unit 310, the first processing unit 380, the first clock termination unit 360, and the second clock termination unit 370 may be similar to those described in the first embodiment shown in FIG. 1.

In the configuration of FIG. 2, when differential data DQ and DQB are transferred having the same amplitude but different phases, main and sub data DQ and DQB are transferred through two different signal lines.

The first data termination unit 420 is coupled with a first data path and has an impedance value decided based on the impedance control signal CNTSIG<0:N>.

The second data termination unit 430 is coupled with a second data path and has an impedance value decided based on the first process signal MOD_CNTSIG1<0:N>.

For illustration purposes, FIG. 2 illustrates that a first clock is a main data clock WCK, and a second clock is a sub data clock WCKB. FIG. 2 also illustrates that a first data is a main data DQ, and a second data is a sub data DQB. The first data termination unit 420 terminates a main data (DQ) pad based on an impedance value decided by an impedance control signal CNTSIG<0:N>. The first data termination unit 420 matches the impedance of the main data DQ that is inputted into the main data pad. Herein, the main data pad means a pad in charge of the input of the main data DQ. The second data termination unit 430 terminates a sub data DQB pad based on an impedance value decided by a first process signal MOD_CNTSIG1<0:N>. The second data termination unit 430 matches the impedance of the sub data DQB that is inputted into the sub data pad. Herein, the sub data pad means a pad in charge of the input of the sub data DQB.

When differential data are transferred, the level of a data is decided based on the relative level difference between the main data DQ and the sub data DQB. More specifically, when the main data DQ has a greater level than the sub data DQB, the level of the data is high, and when the main data DQ has a lower level than the sub data DQB, the level of the data is low.

For example, when the pulse duration of high data and the pulse duration of low data are different, and the duty cycle of the data is mismatched. In other words, when the duration that the main data DQ is greater than the sub data DQB and the duration where the main data DQ is smaller than the sub data DQB are different, the duty cycle of data is distorted because the high-pulse duration and the low-pulse duration of the data are different.

Therefore, when the duty cycle of the data is distorted, the duty cycle may be corrected by controlling the common mode voltage level of either the main data DQ or the sub data DQB. For example, when the high-pulse duration of the data is longer than the low-pulse duration, the common mode voltage level of the main data DQ may be decreased. By decreasing the common mode voltage level of the main data DQ, the duration where the main data DQ is greater than the sub data DQB is decreased and thus the high-pulse width of the data is reduced. The high pulse width may also be reduced by increasing the common mode voltage level of the sub data DQB.

Here, the common mode voltage level of the main data DQ or the sub data DQB may be changed by controlling the termination resistance value of the main data DQ or the sub data DQB. In other words, when the termination resistance value of the main data DQ is increased, the common mode voltage level of the main data DQ is decreased. When the termination resistance value of the main data DQ is decreased, the common mode voltage level of the main data DQ is increased. Likewise, when the termination resistance value of the sub data DQB is increased, the common mode voltage level of the sub data DQB is decreased, and when the termination resistance value of the sub data DQB is decreased, the common mode voltage level of the sub data DQB is increased.

Therefore, the semiconductor device according to the embodiment of the present invention may correct the duty cycle of the data clock by controlling the termination resistance value of either the main data clock WCK or the sub data clock WCKB, and therefore may correct the duty cycle of the data by controlling the termination resistance value of either the main data DQ or the sub data DQB.

The termination resistance value of the data clock and the termination resistance value of the data are illustrated to be the based on the same control signals in the second embodiment of the present invention shown in FIG. 2 (more specifically, the reason why the first clock termination unit 360 and the first data termination unit 420 both controlled by the impedance control signal CNTSIG<0:N> and the second clock termination unit 370 and the second data termination unit 430 are both controlled by the first process signal MOD_CNTSIG1<0:N>). The reason the data clock and the data are controlled by the same control signals is because the data clock and the data are transferred through neighboring paths. Also, when the common mode voltage level of the data clock is changed, the common mode voltage level of the data may also be affected and changed.

However, since the data clock and the data are transferred through different transfer lines, the extents of duty cycle distortion of the data clock and the data may be different. A processor for deciding the termination resistance value of the data clock and a processor for deciding the termination resistance value of the data may be provided independently if the two transfer lines have different amounts of duty cycle distortion.

Figure 3:
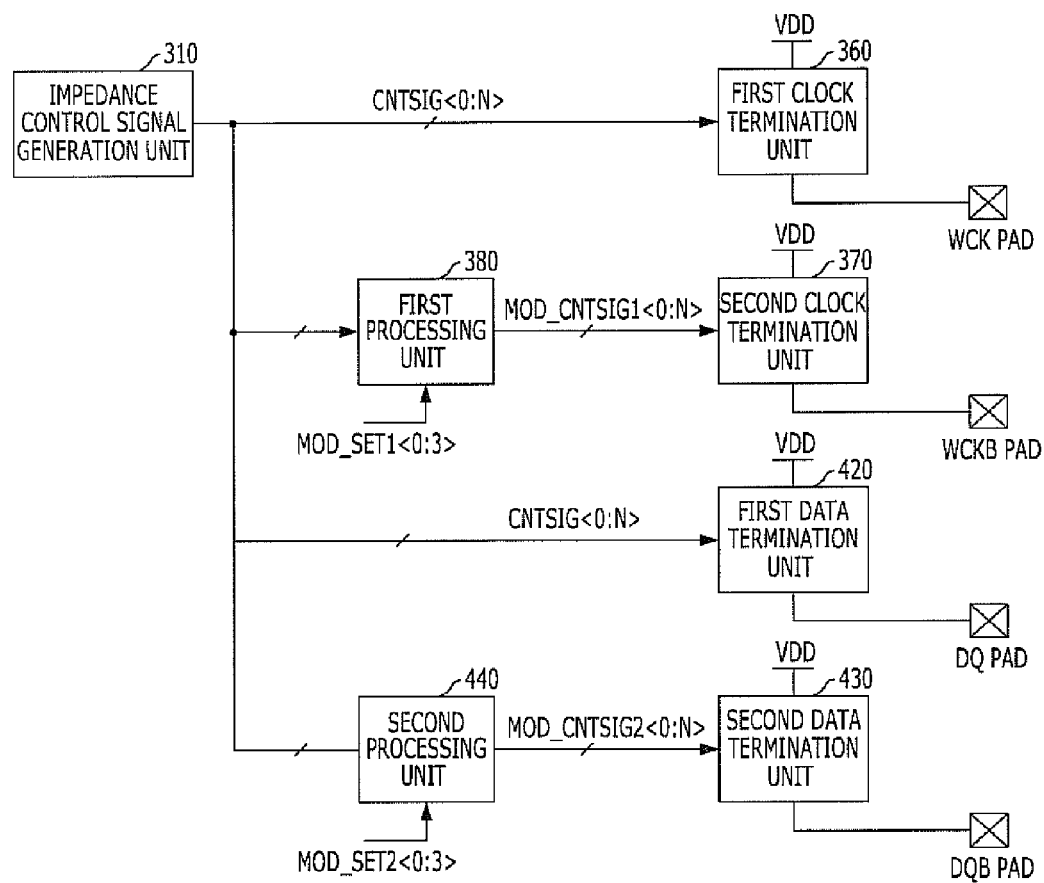
FIG. 3 is a block view illustrating a semiconductor device in accordance with a third embodiment of the present invention.

The two processing unit embodiment, as described above, is shown in FIG. 3. As shown in FIG. 3, the semiconductor device may include the impedance control signal generation unit 310, the first processing unit 380, the first clock termination unit 360, the second clock termination unit 370, a second processing unit 440, the first data termination unit 420, and the second data termination unit 430. For illustration purposes, FIG. 3 illustrates a case where a first clock is a main data clock WCK; a second clock is a sub data clock WCKB; a first data is a main data DQ; and a second data is a sub data DQB.

The structures and operations of the impedance control signal generation unit 310, the first processing unit 380, the first clock termination unit 360, and the second clock termination unit 370 may be similar to those of the embodiment shown in FIG. 1.

The second processing unit 440 processes the impedance control signal CNTSIG<0:N> in response to a second setup value MOD_SET2<0:3> and generates a second process signal MOD_CNTSIG2<0:N>. The second setup value MOD_SET2<0:3> is a signal that is used corrects the duty cycle. The structure and operation of the second processing unit 440 may be similar to those of the first processing unit 380, except that the second processing unit 440 receives the second setup value MOD_SET2<0:3> instead of the first setup value MOD_SET1<0:3>, and that the second processing unit 440 generates the second process signal MOD_CNTSIG2<0:N> instead of the first process signal MOD_CNTSIG1<0:N>.

The first data termination unit 420 terminates a main data (DQ) pad based on the impedance control signal CNTSIG<0:N>. The first data termination unit 420 has an impedance value that matches the impedance of the main data DQ that is inputted to the main data pad.

The second data termination unit 430 terminates a sub data (DQB) pad based on the second process signal MOD_CNTSIG2<0:N>. The second data termination unit 430 has an impedance value that matches the impedance of the sub data DQB that is inputted to the sub data pad.

The semiconductor device according to the embodiment of the present invention may correct the duty cycle of the data clock by controlling the termination resistance value of either the main data clock WCK or the sub data clock WCKB by using the first process signal MOD_CNTSIG1<0:N>, and correct the duty cycle of data by controlling the termination resistance value of either the main data DQ or the sub data DQB by using the second process signal MOD_CNTSIG2<0:N>.

As described above, the duty cycle distortion of the data clock and the data are caused due to mismatch of a clock generator, external noise flowing in during the transferring, and attenuation of the amplitude of electrical signals on transfer lines, which may be different on each transfer line. The termination resistance values of the data clock and the data may be corrected by independently forming the first processing unit 380 and the second processing unit 440.

Figure 4:
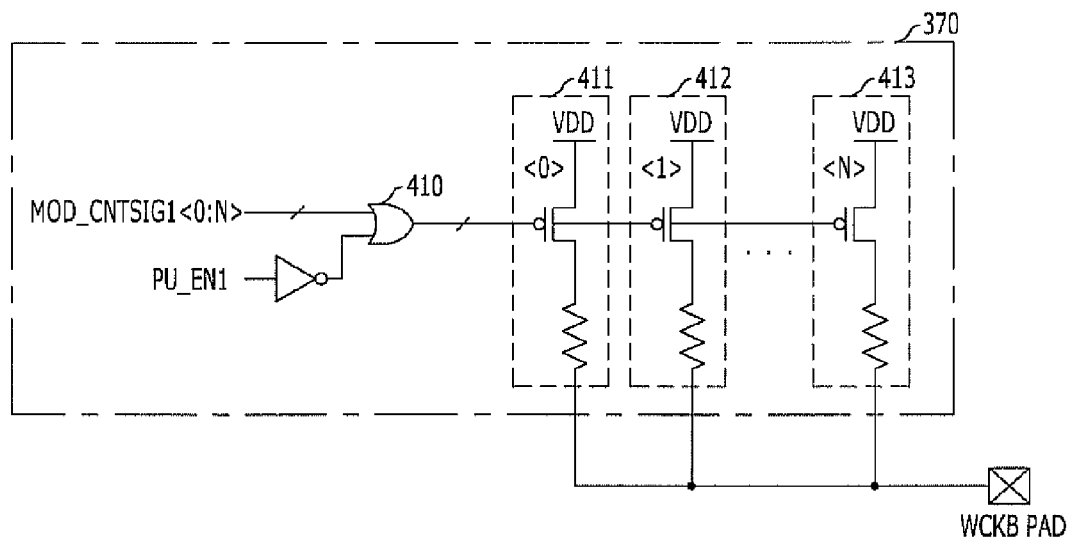
FIG. 4 is a circuit diagram illustrating a second clock termination unit 370 shown in FIG. 3.

FIG. 4 is a circuit diagram illustrating a second clock termination unit 370 shown in FIG. 3. For illustration purposes, FIG. 4 shows that a second clock is a sub data clock WCKB.

Referring to FIG. 4, the second clock termination unit 370 includes a plurality of pull-up termination resistors 411 to 413 that are turned on or off according to the first process signal MOD_CNTSIG1<0:N> when a pull-up termination operation is enabled. The pull-up termination resistors 411 to 413 are coupled in parallel with the sub data clock (WCKB) pad and performs a pull-up termination onto the sub data clock pad. When a pull-up termination enable signal PU_EN1 is disabled and at a logic low level, a signal that is outputted through an OR gate 410 is '1'. Thus, all of the pull-up termination resistors 411 to 413 are turned off when the pull-up termination enable signal PU_EN1 is disabled, and no pull-up termination operation is performed. When the pull-up termination enable signal PU_EN1 is enabled to a logic high level, the signal output from the OR gate 410 is the first process signal MOD_CNTSIG1<0:N>, and the first process signal MOD_CNTSIG1<0:N> is inputted to the pull-up termination resistors 411 to 413. When the pull-up termination enable signal PU_EN1 is enabled, the pull-up termination resistors 411 to 413 are turned on or off according to the value of the first process signal MOD_CNTSIG1<0:N> and terminates the sub data clock pad.

The first clock termination unit 360, the first data termination unit 420, and the second data termination unit 430 may have the same structure as the second clock termination unit 370, but their input signals may be different.

Although the above described embodiments show that the main data clock (WCK) pad, the sub data clock (WCKB) pad, the main data (DQ) pad, and the sub data (DQB) pad are pull-up terminated, the main data clock (WCK) pad, the sub data clock (WCKB) pad, the main data (DQ) pad, and the sub data (DQB) pad may be designed to perform a pull-down termination. Whether a pull-up or pull-down termination is applied depends upon the system that the semiconductor device is applied within.

Figure 5:
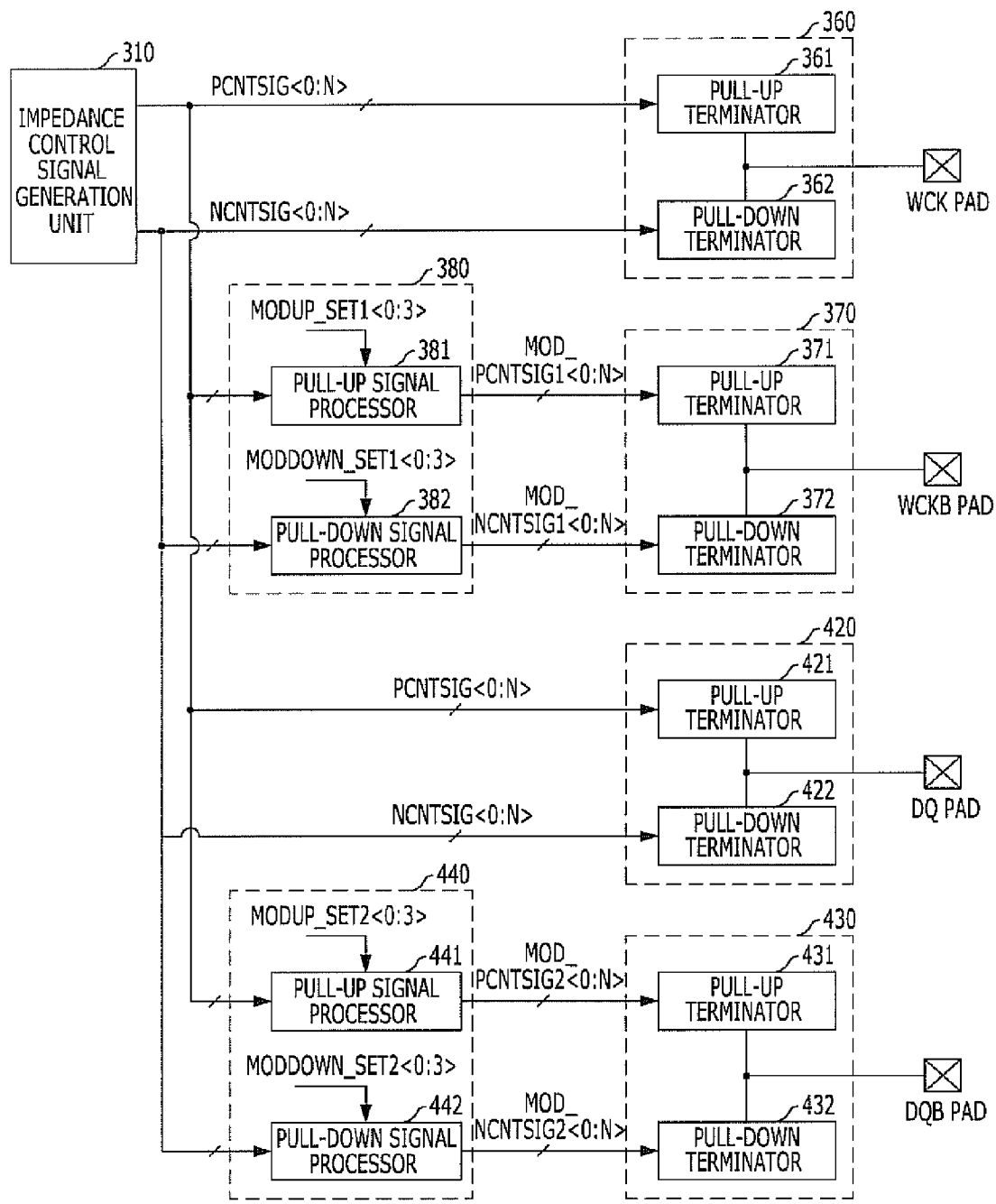
FIG. 5 is a block view illustrating a semiconductor device in accordance with a fourth embodiment of the present invention.

FIG. 5 is a block view illustrating a semiconductor device in accordance with a fourth embodiment of the present invention.

FIG. 5 illustrates an embodiment where the termination regulation units for the main data clock (WCK) pad, the sub data clock (WCKB) pad, the main data (DQ) pad, and the sub data (DQB) pad include pull-up termination and pull-down termination. The basic operation of the embodiment shown in FIG. 5 is similar to that of FIG. 3, except that the main data clock (WCK) pad, the sub data clock (WCKB) pad, the main data (DQ) pad, and the sub data (DQB) pad may be pull-up and pull-down terminated. For illustration purposes, FIG. 5 shows a case where a first clock is a main data clock WCK; a second clock is a sub data clock WCKB; a first data is a main data DQ; and a second data is a sub data DQB.

The impedance control signal generation unit 310 generates a pull-up impedance control signal PCNTSIG<0:N> and a pull-down impedance control signal NCNTSIG<0:N>. These two impedance control signals may be used to correct an offset value of a termination resistance value caused by a change in process, voltage, and/or temperature (PVT).

The first processing unit 380 may include a pull-up signal processor 381 and a pull-down signal processor 382. The pull-up signal processor 381 processes the pull-up impedance control signal PCNTSIG<0:N> in response to a first pull-up setup value MODUP_SET1<0:3> and outputs a first pull-up process signal MOD_PCNTSIG1<0:N>. The pull up impedance control signal PCNTSIG<0:N> is a signal to correct the duty cycle. The pull-down signal processor 382 processes the pull-down impedance control signal NCNTSIG<0:N> in response to a first pull-down setup value MODDOWN_SET1<0:3> and outputs a first pull-down process signal MOD_NCNTSIG1<0:N>. The pull down impedance control signal NCNTSIG<0:N> is a signal used to correct the duty cycle. The structure and operation of the pull-up signal processor 381 may be similar to the first processing unit 380 shown in FIG. 1, except that the pull-up signal processor 381 receives the first pull-up setup value MODUP_SET1<0:3> instead of the first setup value MOD_SET1<0:3> and generates a first pull-up process signal MOD_PCNTSIG1<0:N> instead of the first process signal MOD_CNTSIG1<0:N>. The structure and operation of the pull-down signal processor 382 may also be similar to the first processing unit 380 shown in FIG. 1, except that the pull-down signal processor 382 receives a first pull-down setup value MODDOWN_SET1<0:3> instead of the first setup value MOD_SET1<0:3> and generates a first pull-down process signal MOD_NCNTSIG1<0:N> instead of the first process signal MOD_CNTSIG1<0:N>.

The first clock termination unit 360 terminates the main data clock pad with an impedance value that is decided based on the pull-up impedance control signal PCNTSIG<0:N> and pull-down impedance control signal NCNTSIG<0:N>. The first clock termination unit 360 matches the impedance of the main data clock WCK that is inputted into the main data clock pad. More specifically, the first clock termination unit 360 may include a pull-up terminator 361 and a pull-down terminator 362.

The second clock termination unit 370 terminates the sub data clock pad with an impedance value that is decided based on the first pull-up process signal MOD_PCNTSIG1<0:N> and a first pull-down process signal MOD_NCNTSIG1<0:N>. The second clock termination unit 370 matches the impedance of the sub data clock WCK that is inputted into the sub data clock pad. More specifically, the second clock termination unit 370 may include a pull-up terminator 371 and a pull-down terminator 372. The second clock termination unit 370 terminates the sub data clock WCKB that is inputted into the sub data clock pad based on the impedance value of the pull-up terminator 371, which is decided based on the first pull-up process signal MOD_PCNTSIG1<0:N>, and the impedance value of the pull-down terminator 372, which is decided based on the first pull-down process signal MOD_NCNTSIG1<0:N>.

As described above, since the high pulse and low pulse of the data clock are decided based on the relative level difference between the main data clock WCK and the sub data clock WCKB, the duty cycle of the data clock may be corrected by controlling the termination resistance value of either the main data clock WCK or the sub data clock WCKB based on the first pull-up process signal MOD_PCNTSIGI<0:N> and the first pull-down process signal MOD_NCNTSIG1<0: N>.

The second processing unit 440 may include a pull-up signal processor 441 and a pull-down signal processor 442. The pull-up signal processor 441 processes a pull-up impedance control signal PCNTSIG<0:N> in response to a second pull-up setup value MODUP_SET2<0:3> and outputs a second pull-up process signal MOD_PCNTSIG2<0:N>. The pull-up impedance control signal PCNTSIG<0:N> is a signal used to correct the duty cycle. The pull-down signal processor 442 processes a pull-down impedance control signal NCNTSIG<0:N> in response to a second pull-down setup value MODDOWN_SET2<0:3> and outputs a second pull-down process signal MOD_NCNTSIG2<0:N>. The pull-down impedance control signal NCNTSIG<0:N> is a signal used to correct the duty cycle.

The structure and operation of the pull-up signal processor 441 may be similar to the first processing unit illustrated in FIG. 1, except that the pull-up signal processor 441 receives the second pull-up setup value MODUP_SET2<0:3> instead of the first setup value MOD_SET1<0:3> and generates the second pull-up process signal MOD_PCNTSIG2<0:N> instead of the first process signal MOD_CNTSIG1<0:N>. Also, the structure and operation of the pull-down signal processor 442 may be similar to the first processing unit illustrated in FIG. 1, except that the pull-down signal processor 442 receives the second pull-down setup value MODDOWN_SET2<0:3> instead of the first setup value MOD_SET1<0:3> and generates the second pull-down process signal MOD_NCNTSIG2<0:N> instead of the first process signal MOD_CNTSIG1<0:N>.

The first data termination unit 420 terminates the main data pad with an impedance value that is decided based on the pull-up impedance control signal PCNTSIG<0:N> and the pull-down impedance control signal NCNTSIG<0:N>. The first data termination unit 420 matches the impedance of the main data DQ that is inputted through the main data pad. More specifically, the first data termination unit 420 may include a pull-up terminator 421 and a pull-down terminator 422.

The second data termination unit 430 terminates the sub data pad with an impedance value that is decided based on the second pull-up process signal MOD_PCNTSIG2<0:N> and a second pull-down process signal MOD_NCNTSIG2<0:N>. The second data termination unit 430 matches the impedance of the sub data DQB that is inputted into the sub data pad. More specifically, the second data termination unit 430 may include a pull-up terminator 431 and a pull-down terminator 432. The second data termination unit 430 terminates the sub data DQB that is inputted into the sub data pad based on the impedance value of the pull-up terminator 431, which is decided based on the second pull-up process signal MOD_PCNTSIG2<0:N>, and the impedance value of the pull-down terminator 432, which is decided based on the second pull-down process signal MOD_NCNTSIG2<0:N>.

As described above, since the high pulse and low pulse of the data are decided based on the relative level difference between the main data DQ and the sub data DQB, the duty cycle of the data may be corrected by controlling the termination resistance value of either the main data DQ or the sub data DQB based on the second pull-up process signal MOD_PCNTSIG2<0:N> and the second pull-down process signal MOD_NCNTSIG2<0:N>.

For illustration purposes, an embodiment where there is one main data clock pad, one sub data clock pad, one main data pad, and one sub data pad is shown in FIG. 5. However, the amount of pads may be one or more pads for each type of clock, and the present invention may be applied to an embodiment having one or more pads for each type of clock. When there are a plurality of main data clock pads and a plurality of sub data clock pads in an embodiment of the semiconductor device, the semiconductor device may also provide a plurality of first clock termination units 360 and second clock termination units 370 in order to terminate the additional pads. Also, when there are a plurality of main data pads and a plurality of sub data pads in an embodiment of the semiconductor device, the semiconductor device may also provide a plurality of first data termination units 420 and second data termination units 430 in order to terminate the additional pads.

For illustration purposes, FIGS. 1 to 4 show an embodiment where a first clock is a main data clock WCK; a second clock is a sub data clock WCKB; a first data is a main data DQ; and a second data is a sub data DQB. However, the features of the present invention may be applied to a device where a first clock is a sub data clock WCKB; a second clock is a main data clock WCK; a first data is a sub data DQB; and a second data is a main data DQ.

Also, the features of the present invention may be applied to an embodiment where a data clock and a data are not transferred as differential signals. This embodiment is described with reference to FIG. 6.

Figure 6:
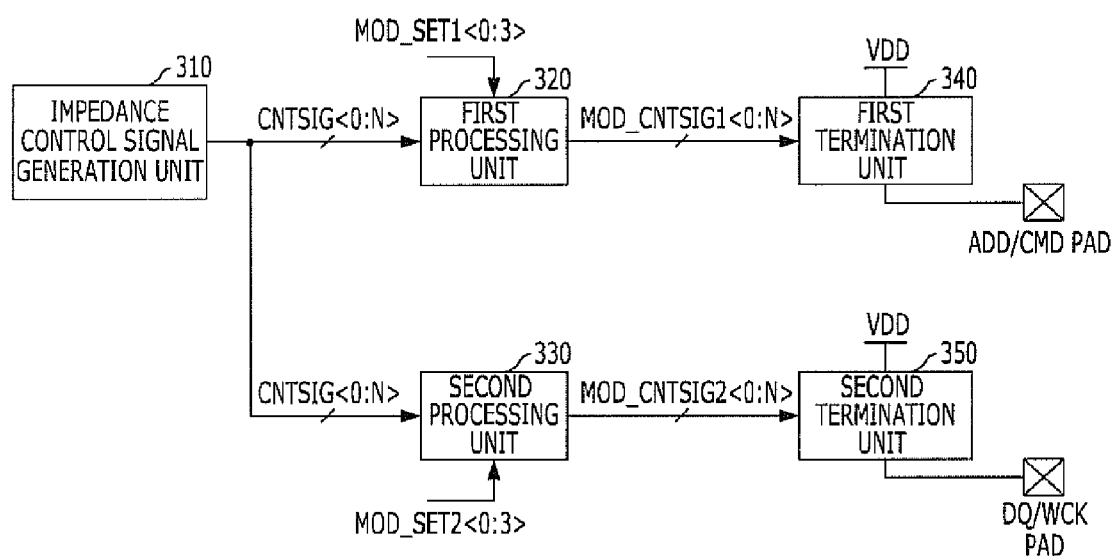
FIG. 6 is a block view illustrating a semiconductor device in accordance with a fifth embodiment of the present invention.

FIG. 6 is a block view illustrating a semiconductor device in accordance with a fifth embodiment of the present invention.

Referring to FIG. 6, the semiconductor device in accordance with the fifth embodiment of the present invention may include an impedance control signal generation unit 310, a first processing unit 320, a second processing unit 330, a first termination unit 340, and a second termination unit 350.

The impedance control signal generation unit 310 generates an impedance control signal CNTSIG<0:N>. The impedance control signal CNTSIG<0:N> may be used to correct an offset value from a termination resistance value caused by a change in process, voltage, and/or temperature (PVT).

The first processing unit 320 processes the impedance control signal CNTSIG<0:N> in response to a first setup value MOD_SET1<0:3> and generates a first process signal MOD_CNTSIG1<0:N>. The first setup value MOD_SET1<0:3> provides information for setting up a termination resistance value, and the first setup value MOD_SET1<0:3> may be set as a termination resistance value offset value. The structure and operation of the first processing unit 320 are similar to the structure and operation of the first processing unit 380 illustrated in FIG. 1.

The first termination unit 340 is coupled with a command (ADD/CMD)-based path, and the first termination unit 340 terminates a command (ADD/CMD)-based pad with an impedance value that is decided based on the first process signal MOD_CNTSIG1<0:N>. The first termination unit 340 matches the impedance of a signal that is inputted to the command (ADD/CMD)-based pad. Herein, the command (ADD/CMD)-based pad means a pad for receiving a command and a pad for receiving an address. The first termination unit 340 may provide the termination resistance value because of the operation of the first processing unit 320. More specifically, the impedance control signal that is outputted from the impedance control signal generation unit 310 may set a target value for the termination resistance value. However, the termination resistance value may have an offset due to a difference in process, voltage, temperature, of the signal transfer lines. To correct the offset, the first processing unit 320 sets a first setup value MOD_SET1 to match the offset value from the termination resistance value and processes the impedance control signal CNTSIG<0:N> The first termination unit 340 sets the termination resistance value closer to the target value based on the first process signal MOD_CNTSIG1<0:N> that is outputted from the first processing unit 320.

The second processing unit 330 processes the impedance control signal CNTSIG<0:N> and generates a second process signal MOD_CNTSIG2<0:N> in response to a second setup value MOD_SET2<0:3> that corrects the duty cycle. The structure and operation of the second processing unit 330 may be similar to the first processing unit 380 shown in FIG. 1, except that the second processing unit 330 receives the second setup value MOD_SET2<0:3> instead of the first setup value MOD_SET1<0:3> and generates the second process signal MOD_CNTSIG2<0:N> instead of the first process signal MOD_CNTSIG1<0:N>.

The second termination unit 350 terminates a data (DQ/WCK)-based pad with an impedance value based on the second process signal MOD_CNTSIG2<0:N>. The second termination unit 350 matches the impedance of a signal that is inputted into the data (DQ/WCK)-based pad. Herein, the data (DQ/WCK)-based pad means a pad for receiving a data and a pad for receiving a data clock that is used for strobing data. When the termination resistance value of the second termination unit 350 is increased, the common mode voltage level of a data clock and a data is decreased so that the high-pulse duration of the data clock and the data becomes shorter. When the termination resistance value of the second termination unit 350 is decreased, the common mode voltage level of a data clock and a data is increased so that the low-pulse duration of the data clock and the data becomes longer. In short, the duty cycle of the data clock and the data may be corrected by controlling the termination resistance value of the second termination unit 350.

In the embodiment illustrated in FIG. 6, the termination impedance value of the data clock WCK and the termination impedance value of the data DQ are based on the same signal, the second process signal MOD_CNTSIG2<0:N>. The data and the data clock are based on the same signal is because the data clock and the data are transferred through adjacent transfer paths. Thus when the common mode voltage level of the data clock is changed, the common mode voltage level of the data may be affected and changed as well.

As described above, the command (ADD/CMD)-based pad may set the termination resistance values of an address signal and a command signal as target values based on the first process signal MOD_CNTSIG1<0:N> by the operations of the first processing unit 320, and the data (DQ/WCK)-based pad may correct the duty cycle of a data and a data clock based on the second process signal MOD_CNTSIG2<0:N> by the operations of the second processing unit 330.

Although FIG. 6 illustrates an embodiment where there is one command (ADD/CMD)-based pad and one data (DQ/WCK)-based pad, the number of the command (ADD/CMD)-based pad and the number of the data (DQ/WCK)-based pad may be one or more. When there are a plurality of command (ADD/CMD)-based pads, one or more first termination units 340 may be provided to terminate the command (ADD/CMD)-based pads, respectively. When there is a plurality of command (ADD/CMD)-based pads, there may be a plurality of command (CMD) pads and a plurality of address (ADD) pads as well. Also, when there are a plurality of data (DQ/WCK)-based pads, one or more second termination units 350 may be provided as well to terminate the data (DQ/WCK)-based pads, respectively. When there are a plurality of data (DQ/WCK)-based pads, there may be a plurality of data (DQ) pads and a plurality of data clock (WCK) pads as well.

The first termination unit 340 and the second termination unit 350 may have a similar structure as the second clock termination unit 370 shown in FIG. 4, except that the first termination unit 340 receives the first process signal MOD_CNTSIG1<0:N>, instead of the second process signal MOD_CNTSIG2<0: N>.

Although FIG. 6 illustrates a case where the first termination unit 340 and the second termination unit 350 perform a pull-up termination onto the command (ADD/CMD)-based pads and the data (DQ/WCK)-based pads, the first termination unit 340 and the second termination unit 350 may be designed to perform a pull-down termination or a pull-up termination and pull-down termination. Whether a pull-up termination, a pull-down termination, or both a pull-up and pull-down termination is used depends upon the termination regulation of a system that the semiconductor device is implemented within.

Furthermore, a combination of the embodiment shown in FIG. 2, 3 or 5 and the embodiment shown in FIG. 6 may be also applied when a data clock that is transferred as a differential signal and a data that is not transferred as a differential signal, or when a data is transferred as a differential signal and a data clock is not transferred as a differential signal.

According to an embodiment of the present invention, the duty cycle distortion of a clock may be minimized by controlling any one termination resistance value of either a main data clock pad or a sub data clock pad.

Also, the duty cycle distortion of a clock may be minimized by controlling the termination resistance values of a command-based pad and a data-based pad.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
an impedance control signal generation unit configured to generate an impedance control signal for controlling an impedance value;
a first processing unit configured to process the impedance control signal in response to a first setup value and generate a first process signal; and
a second clock termination unit configured to be coupled with a second clock path and determine an impedance value responding to the first process signal,
wherein the first setup value comprises a subtraction/addition signal and a first control signal, and
the first processing unit adds or subtracts the first control signal to or from the impedance control signal in response to the subtraction/addition signal.

2. The semiconductor device of claim 1, further comprising:
a first clock termination unit configured to be coupled with a first clock path and determine an impedance value responding to the impedance control signal.

3. The semiconductor device of claim 2, further comprising:
a second data termination unit configured to be coupled with a second data path and determine an impedance value responding to the first process signal.

4. The semiconductor device of claim 3, further comprising: a first data termination unit configured to be coupled with a first data path and determine an impedance value responding to the impedance control signal.

5. The semiconductor device of claim 4, wherein the second setup value comprises a subtraction/addition signal and a second control signal, and
the second processing unit adds or subtracts the second control signal to or from the impedance control signal in response to the subtraction/addition signal.

6. The semiconductor device of claim 4, wherein the first data termination unit determines an impedance value through a pull-up termination operation, and
the second data termination unit determines an impedance value through a pull-up termination operation.

7. The semiconductor device of claim 4, wherein the first data termination unit determines an impedance value through a pull-down termination operation, and
the second data termination unit determines an impedance value through a pull-down termination operation.

8. The semiconductor device of claim 2, further comprising:
a second processing unit configured to process the impedance control signal in response to a second setup value and generate a second process signal;
a first data termination unit configured to be coupled with a first data path and determine an impedance value responding to the impedance control signal; and
a second data termination unit configured to be coupled with a second data path and determine an impedance value responding to the second process signal.

9. The semiconductor device of claim 8, wherein the impedance control signal generation unit generates a pull-up impedance control signal and a pull-down impedance control signal.

10. The semiconductor device of claim 9, wherein the first processing unit further comprises a pull-up signal processor configured to process the pull-up impedance control signal and generate a first pull-up control signal and a pull-down signal processor configured to process the pull-down impedance control signal and generate a first pull-down control signal; and
the second processing unit further comprises a pull-up signal processor configured to process the pull-up impedance control signal and generate a second pull-up control signal and a pull-down signal processor configured to process the pull-down impedance control signal and generate a second pull-down control signal.

11. The semiconductor device of claim 2, wherein the first clock termination unit determines an impedance value through a pull-up termination operation, and
the second clock termination unit determines an impedance value through a pull-up termination operation.

12. The semiconductor device of claim 2, wherein the first clock termination unit determines an impedance value through a pull-down termination operation, and
the second clock termination unit determines an impedance value through a pull-down termination operation.

13. The semiconductor device of claim 2, wherein the first clock termination units comprises:
an OR gate that receives a pull-up termination enable signal and the impedance control signal;
a plurality of pull-up termination resistors that are turned on when the pull-up termination enable signal is enabled and in response to the impedance control signal.

14. The semiconductor device of claim 1, wherein the second clock termination units comprises:
an OR gate that receives a pull-up termination enable signal and the first process signal;
a plurality of pull-up termination resistors that are turned on when the pull-up termination enable signal is enabled and in response to the first process signal.

15. A semiconductor device, comprising:
an impedance control signal generation unit configured to generate an impedance control signal for correcting an impedance value;
a first processing unit configured to process the impedance control signal in response to a first setup value and generate a first process signal;
a second processing unit configured to process the impedance control signal in response to a second setup value and generate a second process signal;
a first termination unit configured to be coupled with a command-based path and determine an impedance value responding to the first process signal; and
a second termination unit configured to be coupled with a data-based path and determine an impedance value responding to the second process signal,
wherein the first setup value comprises a subtraction/addition signal and a first control signal, and
the first processing unit adds or subtracts the first control signal to or from the impedance control signal in response to the subtraction/addition signal.

16. The semiconductor device of claim 15, wherein the second setup value comprises a subtraction/addition signal and a second control signal, and the second processing unit adds or subtracts the second control signal to or from the impedance control signal in response to the subtraction/addition signal.

17. The semiconductor device of claim 15, wherein the first termination unit determines an impedance value through a pull-up termination operation, and the second termination unit determines an impedance value through a pull-up termination operation.

18. The semiconductor device of claim 15, wherein the command-based path comprises a command path and an address path, and the data-based path comprises a data path and a data clock path.

* * * * *